(12) United States Patent
Kanemoto

(10) Patent No.: US 6,927,110 B2
(45) Date of Patent: Aug. 9, 2005

(54) METHOD OF MANUFACTURING A SEMICONDUCTOR DEVICE

(75) Inventor: Kei Kanemoto, Fujimi-machi (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 10/675,574

(22) Filed: Sep. 30, 2003

(65) Prior Publication Data

US 2004/0132237 A1 Jul. 8, 2004

(30) Foreign Application Priority Data

Oct. 4, 2002 (JP) ........................................ 2002-292276

(51) Int. Cl.⁷ ............................................ H01L 21/338
(52) U.S. Cl. ........................ 438/183; 257/336; 257/337; 257/338
(58) Field of Search ................................ 438/183–190; 257/336–338

(56) References Cited

U.S. PATENT DOCUMENTS 6,117,741 A * 9/2000 Chatterjee et al. .......... 438/299
6,515,320 B1 * 2/2003 Azuma et al. .............. 257/288
2002/0076885 A1 * 6/2002 Chen ........................... 438/270

FOREIGN PATENT DOCUMENTS

JP 2000-049348 2/2000

OTHER PUBLICATIONS

Communication from Japanese Patent Office re: counterpart application.

* cited by examiner

Primary Examiner—Hoai Pham
Assistant Examiner—Nathan W. Ha
(74) Attorney, Agent, or Firm—Harness, Dickey & Pierce, P.L.C.

(57) ABSTRACT

A method is provided for manufacturing a semiconductor device with a highly controlled impurity layer without influence from the heat treatment involved in epitaxial growth. The method comprises: forming a dummy gate layer above a semiconductor substrate; forming a spacer layer closely adjacent to each side of the dummy gate layer; selectively forming a silicon layer by epitaxial growth above the semiconductor substrate; forming a gate electrode after removing the dummy gate layer; forming a source/drain region by introducing an impurity into the semiconductor substrate through the silicon layer; and changing the silicon layer into silicide.

5 Claims, 7 Drawing Sheets

METHOD OF MANUFACTURING A SEMICONDUCTOR DEVICE

BACKGROUND OF THE INVENTION

1. Field of the Invention

The present invention relates to a method for manufacturing a semiconductor device, and more particularly to a method for manufacturing a semiconductor device by an elevated source/drain technology which forms a silicon layer on a source/drain region by selective epitaxial growth.

2. Related Art

In elevated source/drain technology, a single-crystal silicon layer is formed by epitaxial growth on a source/drain region formed in a semiconductor substrate, then a suicide reaction takes place on the silicon layer, and thus forms a silicide layer on the semiconductor substrate. This process enables an impurity layer of the source/drain region to be shallower, and thereby contributes to the miniaturization of elements.

Referring to the elevated source/drain technology, the technology generally requires heat treatment reaching a temperature of 700° C. or higher in a process forming silicon by epitaxial growth. Consequently, an impurity profile in the source/drain region previously formed by ion implantation is changed, which may make it difficult to suit an impurity profile requested by design specifications.

In addition, when using a metal gate, performing the above-mentioned heat treatment of 700° C. or higher after forming the metal gate can deteriorate the properties of a gate insulating layer, as a result of a surface reaction between a material of the metal gate and a material of the gate insulating layer.

An object of the present invention is to provide a method for manufacturing a semiconductor device which can form a highly controlled impurity layer without influence from the above-mentioned heat treatment in the process of epitaxial growth.

SUMMARY

A manufacturing method according to the present invention comprises: forming a dummy gate layer above a semiconductor substrate; forming a spacer layer closely adjacent to each side of the dummy gate layer above the semiconductor substrate; selectively forming a silicon layer by epitaxial growth above the semiconductor substrate; forming a gate electrode after removing the dummy gate layer; forming a source/drain region by introducing an impurity into the semiconductor substrate through the silicon layer; and changing the silicon layer into silicide.

According to the present invention, after forming the silicon layer by epitaxial growth, the gate electrode is formed, and then the source/drain region is formed. Therefore, an impurity layer can be formed without the effect of high-temperature annealing in the process of epitaxial growth, which restricts the diffusion of an impurity, and thereby enables a shallow impurity layer having an impurity profile along with design specifications to be successfully formed. At the same time, the gate electrode can be formed without any effects of high-temperature annealing in the process of epitaxial growth, which enables to not only polysilicon but also metal such as tantalum to be used as a material of the gate electrode. Thus, the range of materials that can be selected for the gate electrode can be expanded.

In the present invention, "forming a certain layer above a semiconductor substrate" includes forming a certain layer directly on a semiconductor substrate and forming the certain layer through another layer on the semiconductor substrate. Also in the present invention, "a silicon layer" may include not only a layer made of silicon as a single component but also a layer composed of silicon and another material such as germanium. Moreover, "a source/drain region" means a source region and/or a drain region.

A manufacturing method according to the present invention is described below in further detail.

A first aspect according to the present invention may comprise: forming an insulating layer for isolation on a semiconductor substrate; forming a dummy gate layer above the semiconductor substrate; forming a spacer layer closely adjacent to each side of the dummy gate layer above the semiconductor substrate; selectively forming a silicon layer by epitaxial growth above the semiconductor substrate; forming a gate electrode after removing the dummy gate layer; forming an extension region by introducing an impurity into the semiconductor substrate from which the spacer layer is removed by ion implantation after removing the spacer layer; forming an insulating layer for a side wall closely adjacent to each side of the gate electrode; forming a source/drain region by introducing an impurity into the semiconductor substrate through the silicon layer by ion implantation; and changing the silicon layer into silicide.

In this aspect, after depositing a material different from the dummy gate layer above the semiconductor, the spacer layer may be formed by anisotropic etching.

A second aspect according to the present invention may comprise: forming an insulating layer for isolation on a semiconductor substrate; forming a groove in a predetermined region after forming an insulating layer above the semiconductor substrate; forming a dummy gate layer above the semiconductor substrate, the dummy gate layer including a lower portion in the groove and an upper portion which is wider than the width of the groove, the upper portion having a side positioned outside of the groove; patterning the insulating layer by using the dummy gate layer as a mask, and forming a spacer layer closely adjacent to each side of the dummy gate layer above the semiconductor substrate; selectively forming a silicon layer by epitaxial growth above the semiconductor substrate; forming a gate electrode after removing the dummy gate layer; forming an extension region by introducing an impurity into the semiconductor substrate from which the spacer layer is removed by ion implantation after removing the spacer layer; forming an insulating layer for a side wall closely adjacent to each side of the gate electrode; forming a source/drain region by introducing an impurity into the semiconductor substrate through the silicon layer by ion implantation; and changing the silicon layer into silicide.

The first and second aspects may comprise, after forming the silicon layer, forming a stopper layer composed of silicon oxide on the surface of the silicon layer by thermal oxidation. This enables the stopper layer, which protects the silicon layer from etching, to be selectively formed.

DETAILED DESCRIPTION

Embodiments of the present invention are described below with reference to the drawings.

First Embodiment

FIGS. 1 to 8 are sectional views showing a manufacturing method according to the first embodiment.

Figure 1:
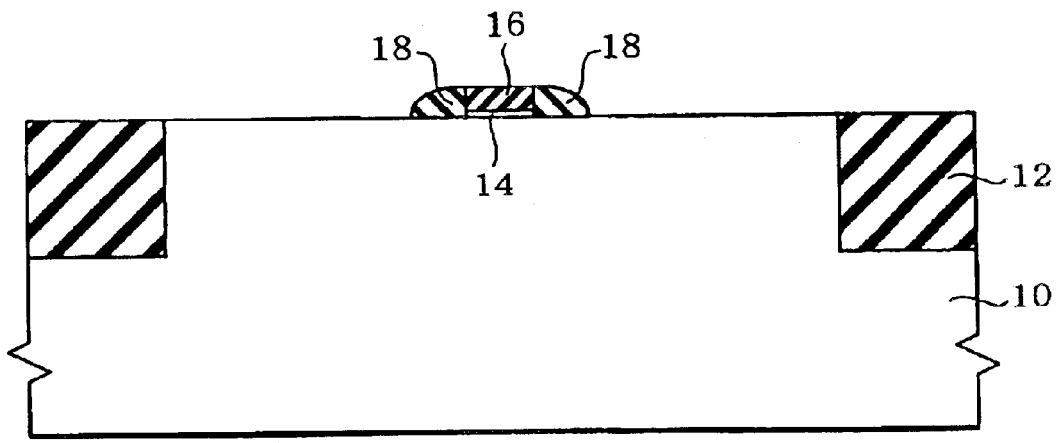
FIG. 1 is a sectional view schematically showing a step of the manufacturing method according to the first embodiment.

(a) As shown in FIG. 1, an insulating layer for isolation 12 is formed in a semiconductor substrate 10 composed of, for example, silicon. The insulating layer for isolation 12 may be formed by a known. The insulating layer for isolation 12 is formed by, for example, a method of shallow trench isolation.

Next, a silicon oxide layer is formed on the surface of the semiconductor substrate 10 by thermal oxidization. Then a silicon nitride layer is formed on the silicon oxide layer by CVD. Subsequently, a protective layer 14 and a dummy gate layer 16 are formed by patterning the silicon oxide layer and the silicon nitride layer, respectively, through lithography (e.g. lithography utilizing light, an X-ray, or an electron beam) and etching (e.g. reactive ion etching) processes. The width of the protective layer 14 is equivalent to the gate length.

The protective layer 14 formed in this step has a function to protect the semiconductor substrate 10 in a later step (d) of etching the dummy gate layer 16. The thickness of the protective layer 14 is set so as to provide this protective function and to be removed as easily as possible. Taking these points into account, the protective layer 14 has a thickness in a range from a few to about ten nanometers. The protective layer 14 can be omitted when it is unnecessary. The thickness of the dummy gate 16 is set in consideration of the plugging capability of an electrode material used in a later step (e) of forming a gate electrode. The dummy gate 16 may have a thickness, for example, in a range from about ten (10) to about one hundred (100) nanometers.

Next, a spacer layer 18 is formed closely adjacent to each side of the dummy gate layer 16. The spacer layer 18, after depositing a silicon oxide layer on the substrate by CVD, is formed by anisotropic etching such as reactive ion etching. Therefore, the spacer layer 18 is composed of a material that is different from the material of the dummy gate 16, so as to take a sufficiently different selective ratio from the dummy gate layer 16 in the etching process. In this embodiment, the dummy gate layer 16 is composed of silicon nitride, while the spacer layer 18 is composed of silicon oxide.

Figure 2:
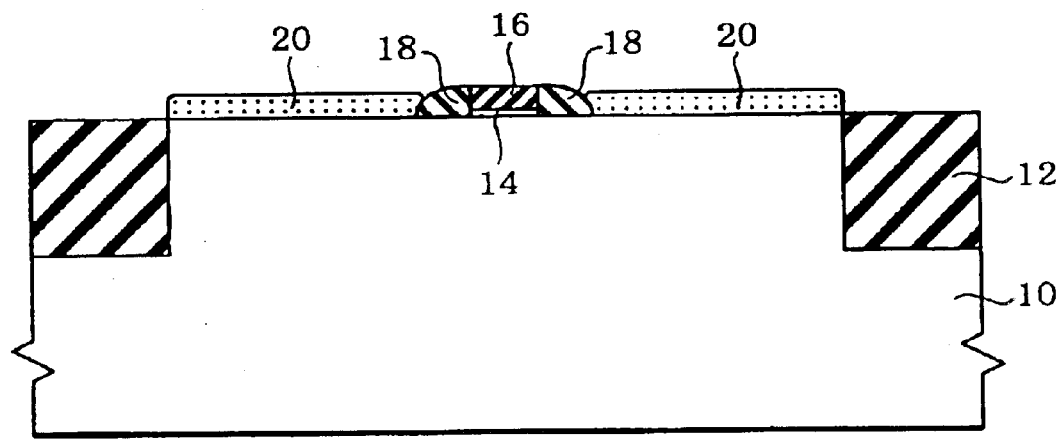
FIG. 2 is a sectional view schematically showing a step of the manufacturing method according to the first embodiment.

(b) As shown in FIG. 2, a silicon layer 20 is selectively formed on the semiconductor substrate 10 by epitaxial growth. The thickness of the silicon layer 20 is determined in consideration of the thickness necessary for a silicide step on the semiconductor substrate 10 and the thickness necessary for thermal oxidation in the next step (c) of forming a silicon oxide layer (a stopper layer). Taking this point into account, the thickness of the silicon layer 20 is set in a range from about fifty (50) to about one hundred (100) nanometers.

The silicon layer 20 is formed by epitaxial growth. The silicon layer 20 is formed, for example, as shown below. First, the surface of the semiconductor substrate 10 is cleaned by, for example, RCA cleaning. The RCA cleaning includes a step of removing a natural oxide film by light etching with dilute hydrofluoric acid in the last part of its process. Next, the oxide film on the surface of the semiconductor substrate 10 is completely removed by performing heat treatment in a hydrogen atmosphere or in a vacuum. Then, a gas such as $SiH_xCl_{4-x}$ (x=0 to 4), $Si_2H_6$, $Si_3H_8$, $GeH_4$, $H_2$, and $Cl_2$ is supplied to deposition equipment, while the semiconductor substrate 10 is heated to a temperature of 800° C. or higher. Accordingly, the silicon layer 20 is selectively formed on the exposed portion of the semiconductor substrate 10 by epitaxial growth.

Figure 3:
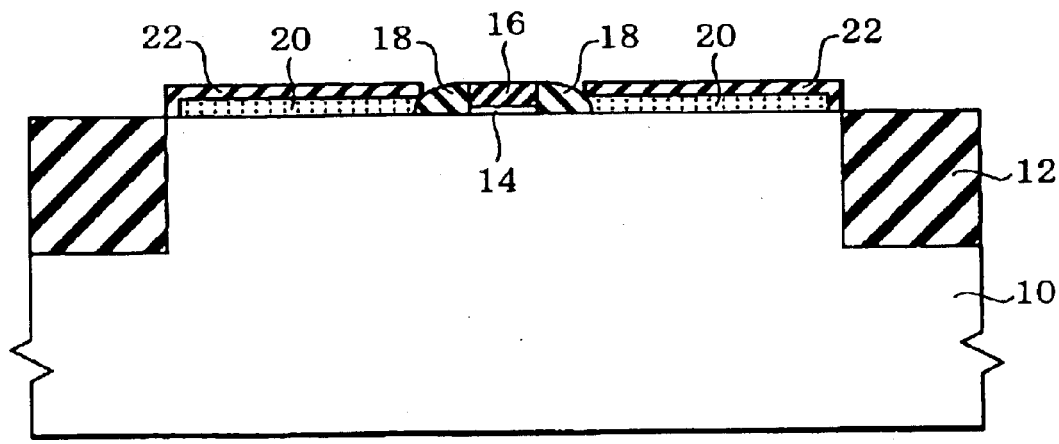
FIG. 3 is a sectional view schematically showing a step of the manufacturing method according to the first embodiment.

(c) As shown in FIG. 3, a stopper layer 22 composed of silicon oxide is selectively formed on the surface of the silicon layer 20 by thermal oxidation. The stopper layer 22 has a function to protect the silicon layer 20 in a later step (e) of etching. Taking this function into consideration, the stopper layer 22 has a thickness in a range from about three (3) to about twenty (20) nanometers.

Figure 4:
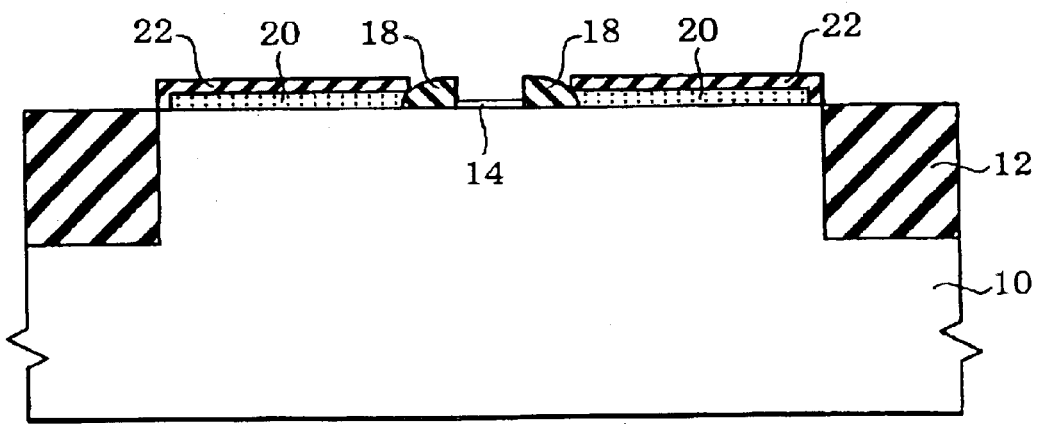
FIG. 4 is a sectional view schematically showing a step of the manufacturing method according to the first embodiment.

(d) As shown in FIG. 4, the dummy gate layer 16 composed of silicon nitride is removed by etching with thermal phosphoric acid. In this step, the semiconductor substrate 10 is covered by the protective layer 14 composed of silicon oxide, while the silicon layer 20 is covered by the stopper layer 22 and the spacer layer 18 both composed of silicon oxide. Therefore, both the semiconductor substrate 10 and the silicon layer 20 are free from damage caused by etching with thermal phosphoric acid. Then, the protective layer 14 is removed by light etching with dilute hydrofluoric acid, and thereby the semiconductor substrate 10 is exposed.

Figure 5:
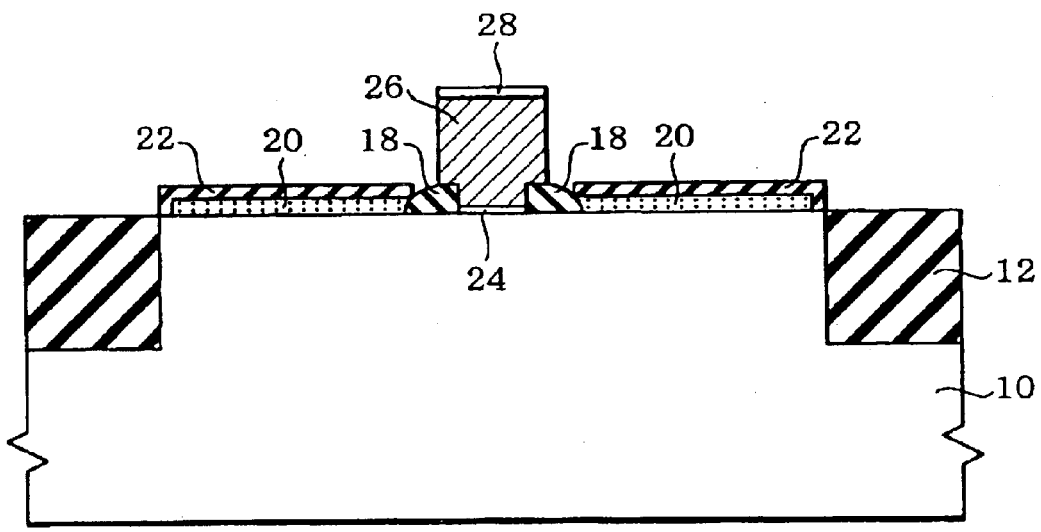
FIG. 5 is a sectional view schematically showing a step of the manufacturing method according to the first embodiment.

(e) As shown in FIG. 5, a gate insulating layer 24, a gate electrode 26, and a cap layer 28 are formed. The gate insulating layer 24 is composed of a high dielectric material such as tantalum oxide, as well as silicon oxide, silicon oxynitride, and silicon nitride. The gate electrode 26 may be composed of polysilicon or metal such as tungsten and tantalum. The cap layer 28 may be composed of silicon oxide or silicon nitride. If the gate electrode 26 is composed of metal such as tantalum, the cap layer is preferably composed of a material with no oxygen such as silicon nitride so as to prevent oxidation of the metal. The cap layer 28 has a function to prevent oxidation of the gate electrode 26 in a step following etching of the gate electrode 26.

In this embodiment, since the gate electrode 26 is formed in a groove portion from which the dummy gate layer 16 is removed, the width of the upper portion of the gate electrode 26 is set wider than the width of the groove portion, so that the groove portion can be completely filled in consideration of mask alignment.

When using tantalum for the gate electrode 26, the gate insulating layer 24 is a silicon nitride layer, the gate electrode 26 is a multilayered structure of a first tantalum nitride layer, a tantalum layer, and a second tantalum nitride layer, and the cap layer 28 is a silicon nitride layer. In this case, the gate insulating layer 24, the gate electrode 26, and the cap layer 28 are formed, for example, by the following process. First, the gate insulating layer is deposited through steps of plasma CVD or high density plasma, atomic layer deposition or sputtering. Next, the gate electrode and the cap layer are formed by patterning with dry etching such as reactive ion etching. The first tantalum nitride layer in the gate electrode 26 functions mainly as a work function control, while the second tantalum nitride layer provides oxidation resistance. Japanese Unexamined Patent Application Publication No. 2001-298193 describes an embodiment of a tantalum gate electrode of such a multilayered structure and is hereby incorporated by reference in its entirety.

Since the silicon layer 20 is covered by the stopper layer 22 and the spacer layer 18 in this step, the silicon layer 20 is free from damage caused while etching the gate electrode 26.

Figure 6:
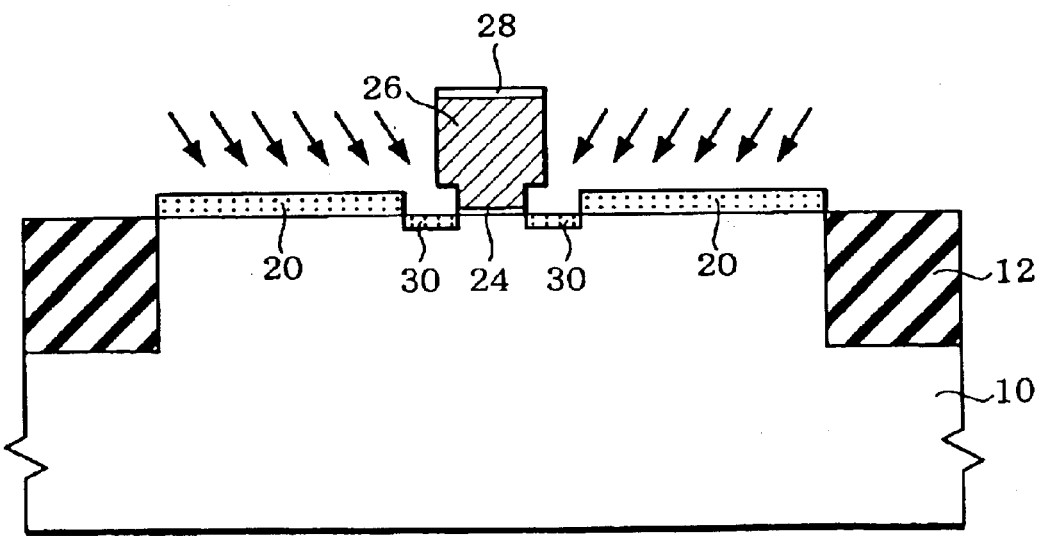
FIG. 6 is a sectional view schematically showing a step of the manufacturing method according to the first embodiment.

(f) As shown in FIG. 6, the spacer layer 18 composed of silicon oxide is etched by, for example, dilute hydrofluoric acid. At the same time, the stopper layer 22 on the silicon layer 20 is etched. Then, an impurity is introduced into the exposed portion (an area from which the spacer layer 18 is removed) of the semiconductor substrate 10, by oblique ion implantation, and thereby an extension layer 30 is formed. The extension layer 30 is formed to be shallower than a source/drain region which is to be formed in the next step (g).

Figure 7:
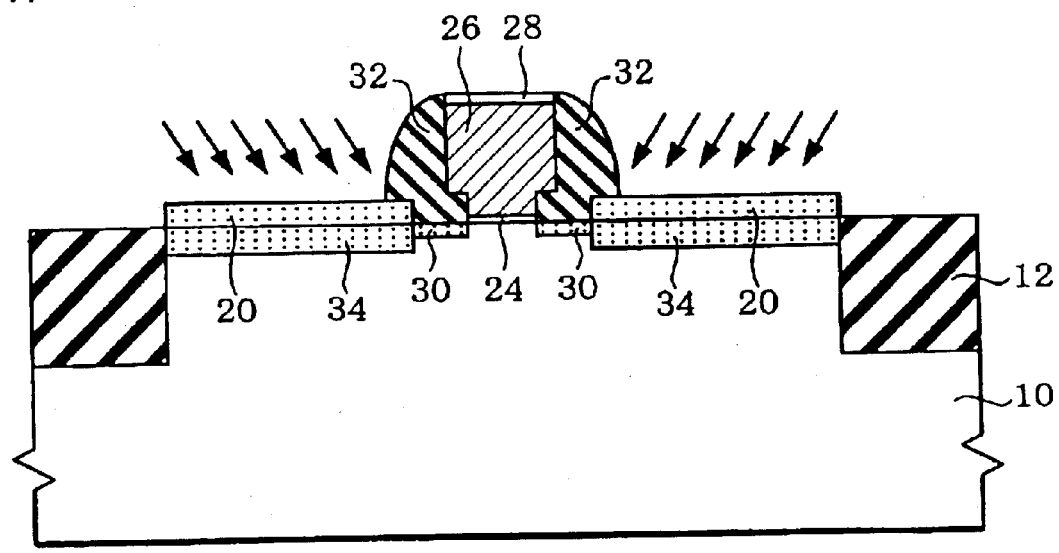
FIG. 7 is a sectional view schematically showing a step of the manufacturing method according to the first embodiment.

(g) As shown in FIG. 7, an insulating layer for a side wall 32 is formed along with each side of the gate insulating layer 24, the gate electrode 26, and the cap layer 28. The insulating layer for a side wall 32 is formed by anisotropic etching such as reactive ion etching, after forming an insulating layer such as a silicon oxide layer or a silicon nitride layer by CVD over the semiconductor substrate 10. If the gate electrode 26 is composed of metal such as tantalum, a silicon nitride layer with no oxygen is preferably used so as to prevent oxidation of the metal.

Next, an impurity is introduced into the semiconductor substrate 10 through the silicon layer 20 by ion implantation (shown as oblique ion implantation in the figure), and thereby a source/drain region 34 is formed. Then, the impurity in the source/drain region is activated by annealing. The temperature of annealing is preferably set so as to restrict thermal diffusion of the impurity and not to harm the gate electrode. In particular, if the gate electrode 26 is composed of metal such as tantalum, low temperature annealing (e.g., 450 to 600° C.) is preferable, because the metal may react to the gate insulating layer under a high temperature of about 700° C. or higher, and thus a gate structure fails to be formed successfully.

Figure 8:
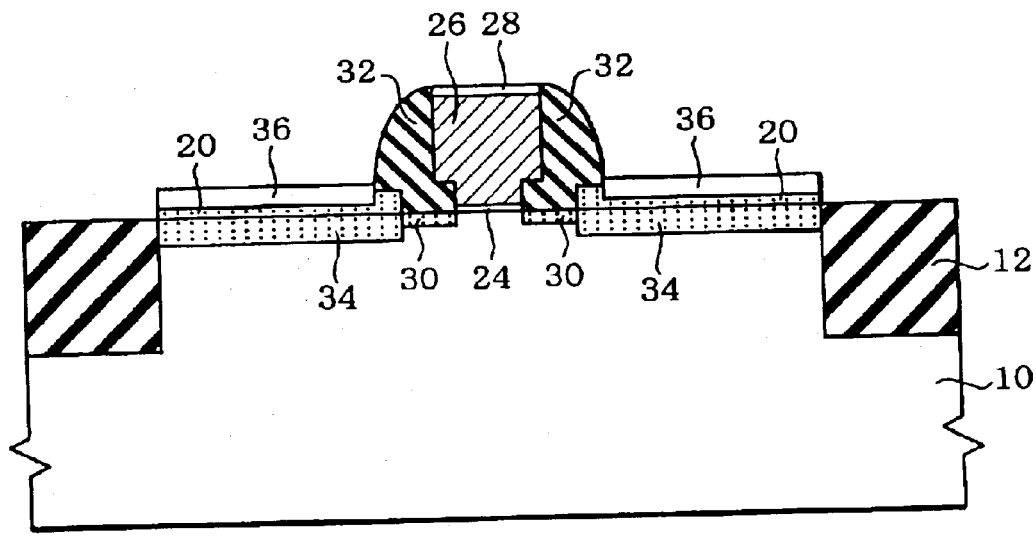
FIG. 8 is a sectional view schematically showing a step of the manufacturing method according to the first embodiment.

(h) As shown in FIG. 8, a suicide layer 36 is formed on the silicon layer 20. The silicide layer 36 is formed by the following. Transition metal such as cobalt, nickel, and titanium, is deposited by sputtering. Subsequently, a silicide layer is formed by self-aligning with the silicon layer 20 by annealing. In this silicide process, the temperature of annealing is preferably set so as to restrict thermal diffusion of the impurity and not to harm the gate electrode. Using nickel as the metal enables the silicide process to be carried out at a low temperature of about 500° C. Even if the gate electrode is composed of metal such as tantalum, this process allows the metal to be unharmed, and also restricts thermal diffusion of the impurity layer.

After this step, an interlayer insulating layer and a wiring layer are formed by conventional processing which completes a semiconductor device.

Major effects and operation of the manufacturing method according to the present invention are described below.

In this embodiment, the silicon layer 20 is formed by epitaxial growth in step (b), the gate electrode 26 is formed in step (e) thereafter, and then the extension region 30 and the source/drain region 34 are formed in steps (f) and (g), respectively. Therefore, the extension region 30 and the source/drain region 34 can be formed without being damaged by the high-temperature annealing in step (b). This restricts the diffusion of an impurity, and thereby enables a shallow impurity layer with an impurity profile according to design specifications to be successfully formed. Forming such a shallow impurity layer is critical for the miniaturization of a device.

At the same time, the gate electrode 26 can be formed free from damage caused by high-temperature annealing in step (b), which enables to not only polysilicon but also metal such as tantalum to be used as a material of the gate electrode. In general, if the gate electrode is composed of metal, the gate electrode reacts to the gate insulating layer (an interface reaction) under a high temperature of about 700° C. or higher, and thus a gate structure fails to be formed successfully.

Therefore, in this embodiment, an annealing process is performed in the temperature range from about 450 to about 600° C. in steps (g) and (h), for example, after step (b), enabling a shallow impurity layer to be formed and a gate electrode to be a metal layer.

In this embodiment, the protective layer 22 composed of silicon oxide is selectively formed on the surface of the silicon layer 20 by thermal oxidation in step (c). The protective layer 22 provides enough thickness to function as a stopper in etching the gate electrode, and thus metal whose selective ratio to silicon oxide is small can be used as a material of the gate electrode.

Second Embodiment

FIGS. 9 to 17 are sectional views showing a manufacturing method according to the second embodiment. Parts shown in these drawings that are substantially the same as those in FIGS. 1 to 8 (the first embodiment) are marked with the same numbers, and their descriptions are omitted. The second embodiment is different from the first embodiment in terms of forming a dummy gate layer and a spacer layer.

Figure 9:
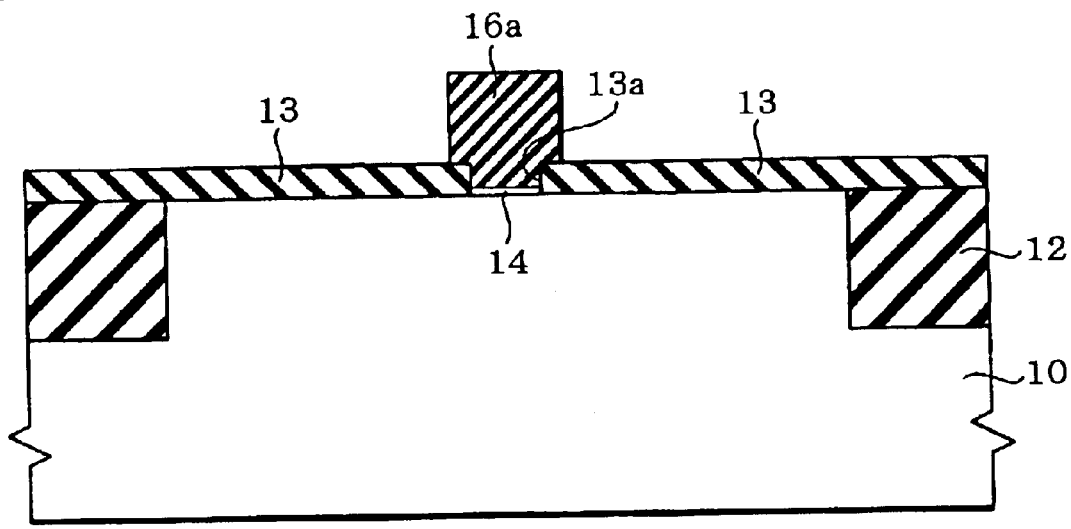
FIG. 9 is a sectional view schematically showing a step of the manufacturing method according to the second embodiment.

(a) As shown in FIG. 9, the insulating layer for isolation 12 is formed in the semiconductor substrate 10 composed of, for example, silicon. Next, the silicon oxide layer 13 is formed on the surface of the semiconductor substrate 10 by CVD. Subsequently, a groove portion 13a is formed by patterning the silicon oxide layer 13 through lithography and etching methods. The width of the groove portion 13a is equivalent to the gate length. Then, a protective layer 14 composed of silicon oxide is formed on the semiconductor substrate 10 by thermal oxidation in the groove portion 13a. The protective layer 14 has a function to protect the semiconductor substrate 10 in a later step (d) of etching a dummy gate layer. The thickness of the protective layer 14 is the same as described in the first embodiment.

Next, a first dummy gate layer 16a is formed above the semiconductor substrate 10, filling the groove portion 13a. The first dummy gate 16a is formed by photolithography and anisotropic etching such as reactive ion etching, after depositing a silicon nitride layer on the substrate by CVD. The first dummy gate layer 16a has a lower portion in the groove portion 13a and an upper portion, which is above the groove portion 13a, and wider than the width of the groove portion 13a. Also, each side of the upper portion is positioned a certain distance from the groove portion 13a.

Figure 10:
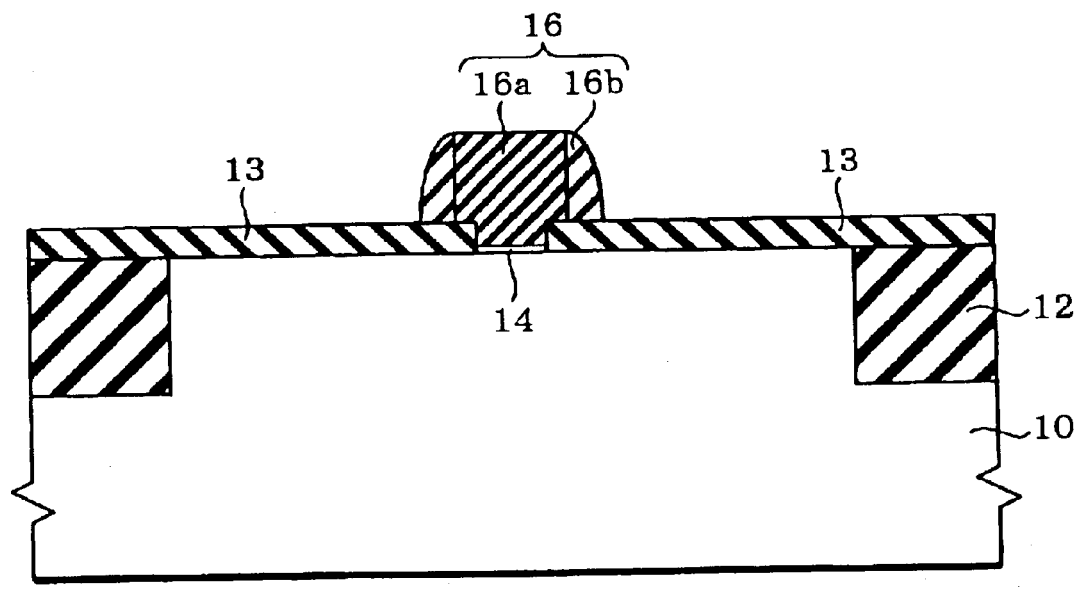
FIG. 10 is a sectional view schematically showing a step of the manufacturing method according to the second embodiment.

Next, as shown in FIG. 10, a second dummy gate layer 16b is formed closely adjacent to each side of the first dummy gate layer 16a as a side wall. The second dummy gate layer 16b is formed by anisotropic etching such as reactive ion etching, after depositing a silicon nitride layer on the substrate by CVD. Accordingly, a dummy gate layer 16 comprising the first dummy gate layer 16a and the second dummy gate layer 16b as a side wall is formed. The dummy gate layer 16 is formed of a material different from that of the silicon oxide layer 13, so as to take a selective ratio which is sufficiently different from the silicon oxide layer 13 in the next step of etching. In this embodiment, like in the first embodiment, the dummy gate layer 16 is composed of silicon nitride, and the spacer layer is composed of silicon oxide.

Figure 11:
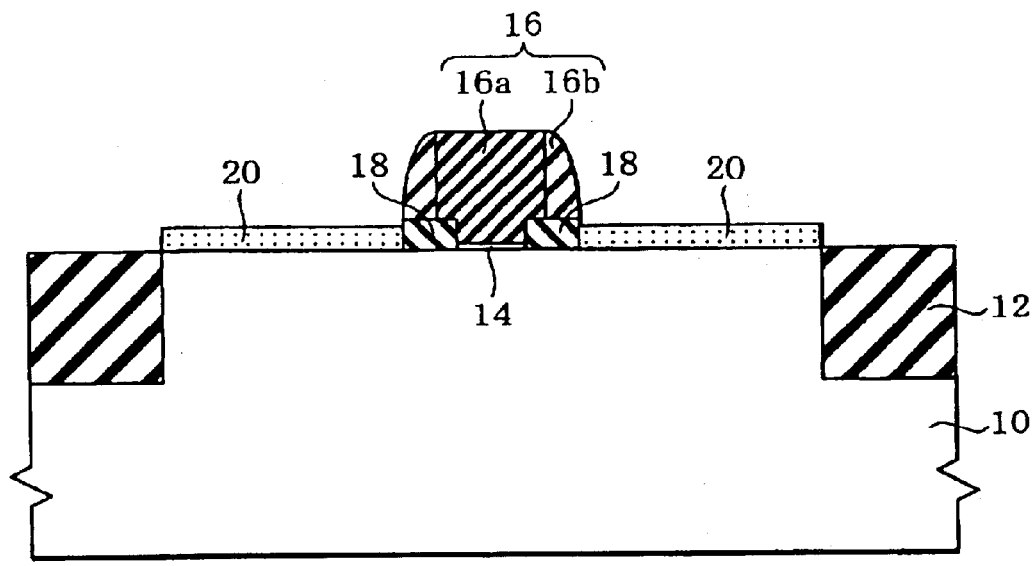
FIG. 11 is a sectional view schematically showing a step of the manufacturing method according to the second embodiment.

(b) As shown in FIG. 11, the spacer layer 18 is formed by etching the silicon oxide layer 13, using the dummy gate layer 16 as a mask.

Next, the silicon layer 20 is selectively formed on the exposed surface of the semiconductor substrate 10 by epitaxial growth. The thickness of the silicon layer 20 is determined in consideration of the thickness necessary for a silicide process on the semiconductor substrate 10 and the thickness necessary for thermal oxidation in the next step (c) of forming a silicon oxide layer (stopper layer). Taking this point into account, the thickness of the silicon layer 20 can be in a range from about fifty (50) to about one hundred (100) nanometers. The silicon layer 20 is formed in the same way as in the first embodiment.

Since the following steps (c) to (h) are the same as those in the first embodiment, only major points are described below.

Figure 12:
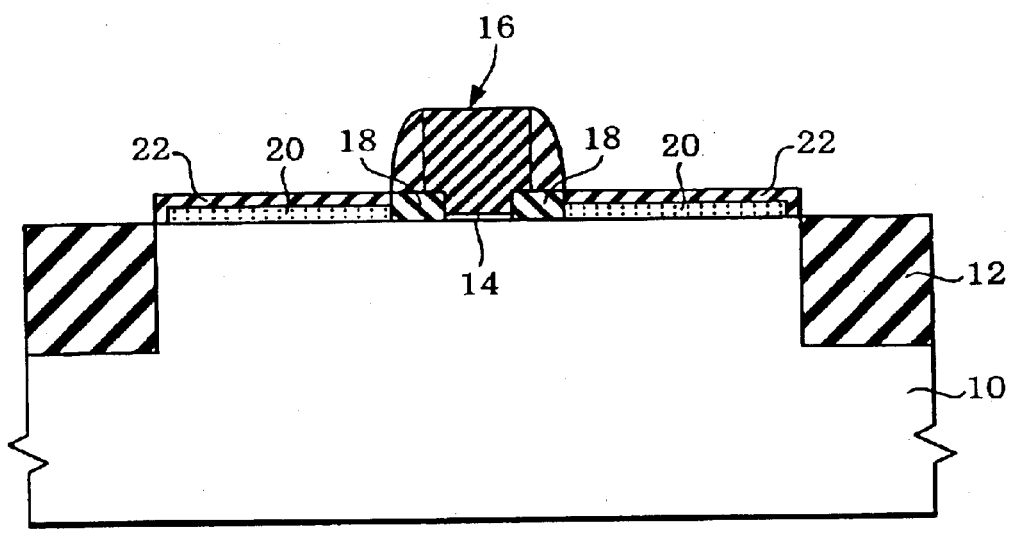
FIG. 12 is a sectional view schematically showing a step of the manufacturing method according to the second embodiment.

(c) As shown in FIG. 12, the stopper layer 22 composed of silicon oxide is selectively formed on the surface of the silicon layer 20 by thermal oxidation. The stopper layer 22 has a function to protect the silicon layer 20 in a later step of etching (e).

Figure 13:
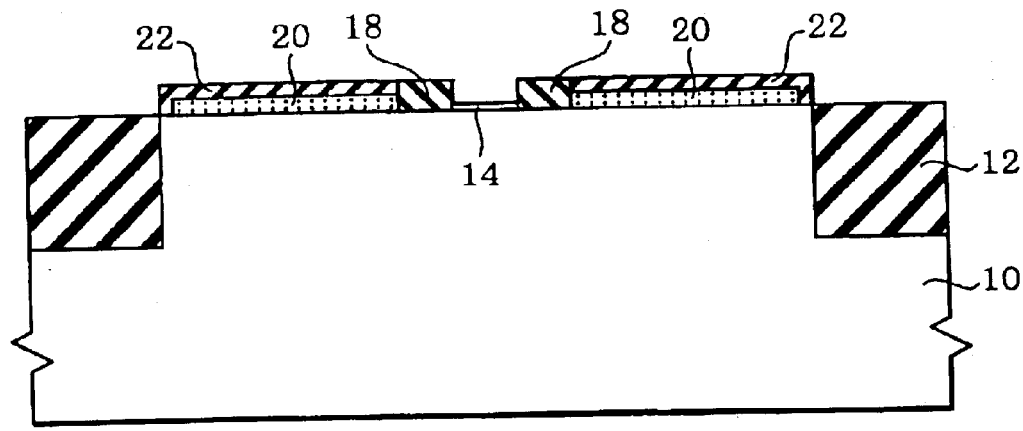
FIG. 13 is a sectional view schematically showing a step of the manufacturing method according to the second embodiment.

(d) As shown in FIG. 13, the dummy gate layer 16 composed of silicon nitride is removed by etching with thermal phosphoric acid. In this step, the semiconductor substrate 10 is covered by the protective layer 14 composed of silicon oxide, while the silicon layer 20 is covered by the stopper layer 22 and the spacer layer 18 both composed of silicon oxide. Therefore, both the semiconductor substrate 10 and the silicon layer 20 are free from damage caused by etching with thermal phosphoric acid.

Then, the protective layer 14 is removed by light etching with dilute hydrofluoric acid, and thereby the semiconductor substrate 10 is exposed.

Figure 14:
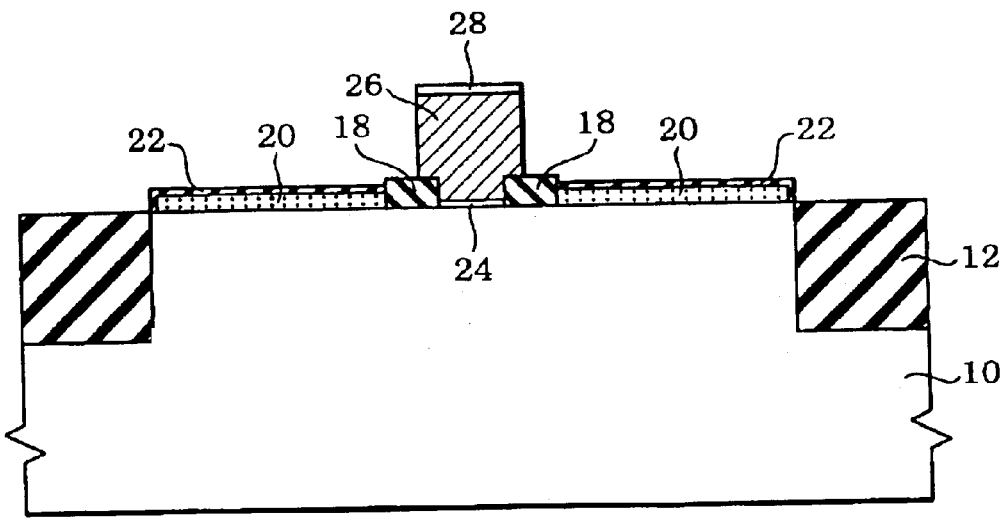
FIG. 14 is a sectional view schematically showing a step of the manufacturing method according to the second embodiment.

(e) As shown in FIG. 14, the gate insulating layer 24, the gate electrode 26, and the cap layer 28 are formed. The gate insulating layer 24, the gate electrode 26, and the cap layer 28 may be formed by adopting the same method and materials as in the first embodiment. Also in this step, since the silicon layer 20 is covered by the stopper layer 22 and the spacer layer 18, the silicon layer 20 is free from damage caused while etching the gate electrode 26.

Figure 15:
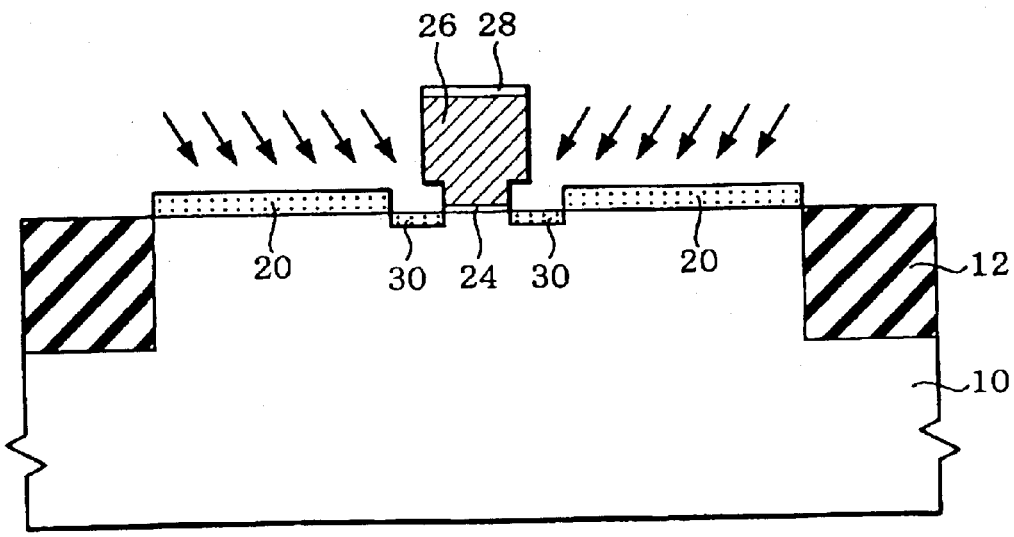
FIG. 15 is a sectional view schematically showing a step of the manufacturing method according to the second embodiment.

(f) As shown in FIG. 15, like in the first embodiment, the spacer layer 18 composed of silicon oxide is etched by, for example, dilute hydrofluoric acid. Then an impurity is introduced into the exposed portion of the semiconductor substrate 10, from which the spacer layer 18 is removed, by (e.g., oblique) ion implantation, and thereby an extension layer 30 is formed.

Figure 16:
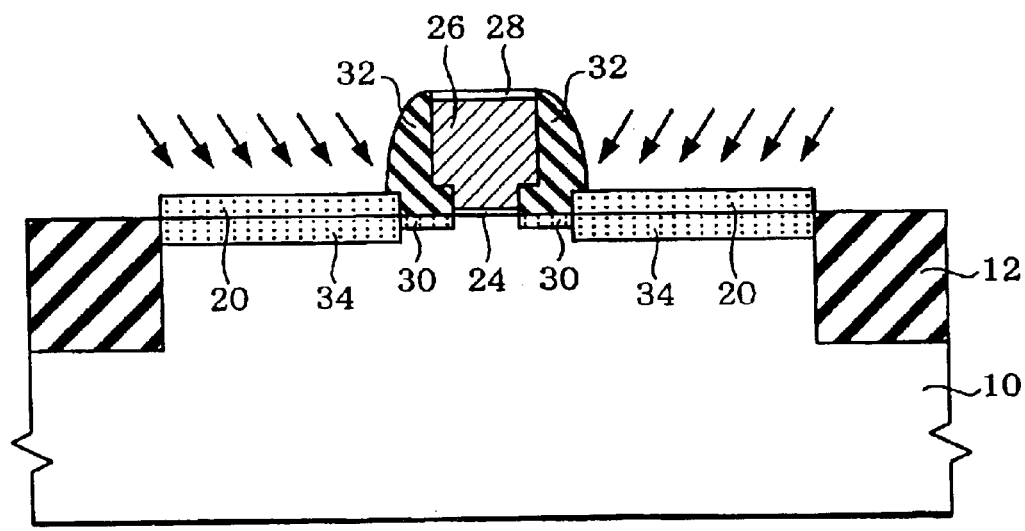
FIG. 16 is a sectional view schematically showing a step of the manufacturing method according to the second embodiment.

(g) As shown in FIG. 16, the insulating layer for a side wall 32 is formed at each side of the gate insulating layer 24, the gate electrode 26, and the cap layer 28. The insulating layer for a side wall 32 is formed by adopting the same method and materials in the first embodiment.

Next, an impurity is introduced into the silicon layer 20 and the semiconductor substrate 10 by ion implantation (shown as oblique ion implantation in the figure), and thereby a source/drain region 34 is formed on the semiconductor substrate 10. Then, an impurity in the source/drain region is activated by annealing. The temperature of annealing is, like in the first embodiment, preferably set so as to restrict thermal diffusion of the impurity and not to harm the gate electrode. In particular, if the gate electrode 26 is composed of metal such as tantalum, low temperature annealing (about 550° C.) is preferable.

Figure 17:
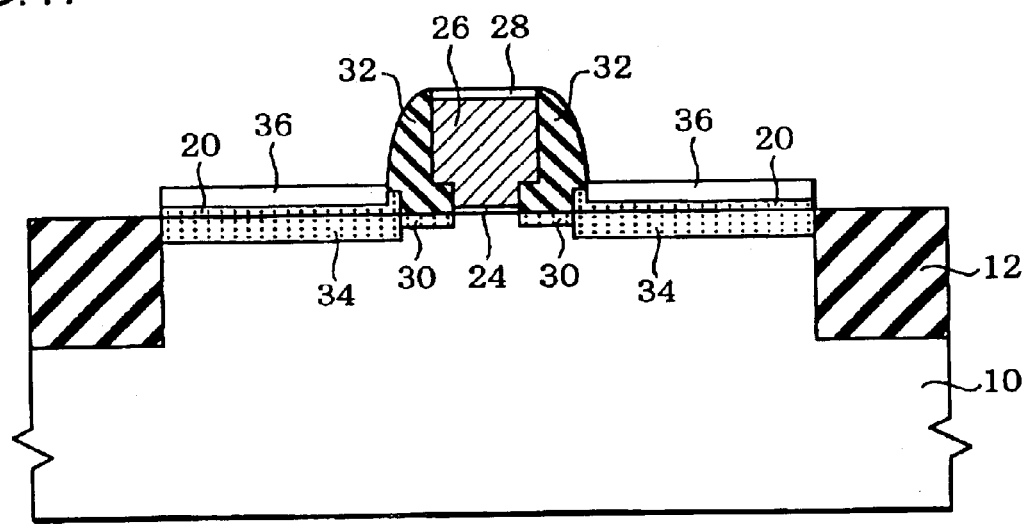
FIG. 17 is a sectional view schematically showing a step of the manufacturing method according to the second embodiment.

(h) As shown in FIG. 17, a silicide layer 36 is formed on the silicon layer 20. The silicide layer 36 is formed by the same method as in the first embodiment. In this silicide process, the temperature of annealing is preferably set so as to restrict thermal diffusion of the impurity and not to harm the gate electrode. Using nickel as the metal enables the silicide process to be carried out at a low temperature of about 500° C. Even if the gate electrode is composed of metal such as tantalum, this process allows the metal to be unharmed, and also restricts thermal diffusion of the impurity layer.

After this step, an interlayer insulating layer and a wiring layer are formed by conventional processing which completes a semiconductor device.

In the second embodiment, the dummy gate layer 16 comprises the first dummy gate layer 16a and the second dummy gate layer 16b. Forming the dummy gate layer 16 through two steps enables the patterning of the first dummy gate layer 16a as well as the gate electrode 26 and the cap layer 28 by using the same mask. Of course, the dummy gate layer 16 may be formed in one step of patterning.

The second embodiment produces the same effects and operation as the first embodiment. That is to say, in this embodiment, the silicon layer 20 is formed by epitaxial growth in step (b), the gate electrode 26 is formed in step (e) thereafter, and then the extension region 30 and the source/drain region 34 are formed in steps (f) and (g), respectively. Therefore, the extension region 30 and the source/drain region 34 can be formed without being damaged by the high-temperature annealing in step (b). This restricts the diffusion of an impurity, and thereby enables a shallow impurity layer with an impurity profile according to design specifications to be successfully formed.

At the same time, the gate electrode 26 can be formed free from damage caused by the high-temperature annealing in step (b), which enables not only polysilicon but also metal such as tantalum to be used as a material of the gate electrode.

Therefore, in this embodiment, the annealing process is performed at a temperature range from about 450 to about 600° C. after step (b), for example, in steps (g) and (h), so as to form a shallow impurity layer and use metal for the gate electrode.

In this embodiment, the protective layer 22 composed of silicon oxide is selectively formed on the surface of the silicon layer 20 by thermal oxidation in step (c). The protective layer 22 provides enough thickness to function as a stopper in etching the gate electrode, and thus metal whose selective ratio to silicon oxide is small can be used as a material of the gate electrode.

The present invention is not limited to the above embodiments, and can be applied to various modes without departing from the spirit of the invention.

The entire disclosure of Japanese Patent Application No. 2002-292276 filed Oct. 4, 2002 is incorporated by reference.

What is claimed is:

1. A method of manufacturing a semiconductor device, comprising:

forming an insulating layer for isolation on a semiconductor substrate;

forming a dummy gate layer above the semiconductor substrate;

forming a spacer layer adjacent each side of the dummy gate layer above the semiconductor substrate;

selectively forming a silicon layer by epitaxial growth above the semiconductor substrate;

forming a gate electrode after removing the dummy gate layer;

forming an extension region by introducing an impurity into the semiconductor substrate by ion implantation after removing the spacer layer;

forming an insulating film for a side wall adjacent each side of the gate electrode;

forming a source/drain region by introducing an impurity into the semiconductor substrate through the silicon layer by ion implantation; and changing the silicon layer into silicide.

2. The method of manufacturing a semiconductor device according to claim 1, wherein the spacer layer is formed by anisotropic etching after depositing a material that is different from the dummy gate layer above the semiconductor substrate.

3. The method of manufacturing a semiconductor device according to claim 1, further comprising, after forming the silicon layer, forming a stopper layer composed of silicon oxide on the surface of the silicon layer by thermal oxidation.

4. A method of manufacturing a semiconductor device, comprising:

forming an insulating layer for isolation on a semiconductor substrate;

forming a groove in a predetermined region after forming an insulating layer above the semiconductor substrate;

forming a dummy gate layer above the semiconductor substrate, the dummy gate layer including a lower portion in the groove and an upper portion which is wider than a width of the groove, the upper portion having a side positioned outside of the groove;

patterning the insulating layer by using the dummy gate layer as a mask, and forming a spacer layer adjacent each side of the dummy gate layer above the semiconductor substrate;

selectively forming a silicon layer by epitaxial growth above the semiconductor substrate;

forming a gate electrode after removing the dummy gate layer;

forming an extension region by introducing an impurity into the semiconductor substrate by ion implantation after removing the spacer layer;

forming an insulating film for a side wall adjacent each side of the gate electrode;

forming a source/drain region by introducing an impurity into the semiconductor substrate through the silicon layer by ion implantation; and changing the silicon layer into silicide.

5. The method of manufacturing a semiconductor device according to claim 4, further comprising, after forming the silicon layer, forming a stopper layer composed of silicon oxide on the surface of the silicon layer by thermal oxidation.

* * * * *

UNITED STATES PATENT AND TRADEMARK OFFICE
CERTIFICATE OF CORRECTION

PATENT NO. : 6,927,110 B2
DATED : August 9, 2005
INVENTOR(S) : Kei Kanemoto

It is certified that error appears in the above-identified patent and that said Letters Patent is hereby corrected as shown below:

Column 1,
Line 16, "suicide" should be -- silicide --.

Column 6,
Line 14, "suicide" should be -- silicide --.

Signed and Sealed this

Twenty-first Day of February, 2006

JON W. DUDAS
*Director of the United States Patent and Trademark Office*